United States Patent
Lanham et al.

(10) Patent No.: US 6,724,645 B1
(45) Date of Patent: Apr. 20, 2004

(54) METHOD AND APPARATUS FOR SHORTENING READ OPERATIONS IN DESTRUCTIVE READ MEMORIES

(75) Inventors: Ralph H. Lanham, Cupertino, CA (US); David Victor Pietromonaco, Sunnyvale, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/356,443

(22) Filed: Jan. 30, 2003

(51) Int. Cl.$^7$ .................................................. G11C 7/00
(52) U.S. Cl. .................. 365/145; 365/149; 365/230.05; 365/189.04; 365/189.01
(58) Field of Search .............................. 365/145, 149, 365/230.05, 189.04, 189.01

(56) References Cited

U.S. PATENT DOCUMENTS

| | | | | |
|---|---|---|---|---|
| 5,121,353 A | * | 6/1992 | Natori | 365/145 |
| 5,841,695 A | * | 11/1998 | Wik | 365/185.08 |
| 5,856,940 A | * | 1/1999 | Rao | 365/149 |
| 5,923,593 A | * | 7/1999 | Hsu et al. | 365/189.04 |
| 6,044,034 A | * | 3/2000 | Katakura | 365/230.05 |
| 6,510,075 B2 | * | 1/2003 | Jain | 365/154 |

OTHER PUBLICATIONS

"Digital Integrated Circuits: A Design Perspective." Jan M. Rabaey Prentice Hall, Inc. 1996 Upper Saddle River, NJ Ch. 10 pp. 551–621.

"A Survey of Circuit Innovations in Ferroelectric Random–Access Memories." Ali Sheikholeslami & Glenn Gulak Proceedings of the IEEE, vol. 88, No. 5, May 2000.

* cited by examiner

*Primary Examiner*—Vu A. Le
(74) *Attorney, Agent, or Firm*—Judy Liao Shie

(57) ABSTRACT

An apparatus and method for shortening the read operation (typically the longest operation) in a destructive read memory is disclosed. The rewrite step is separated from the read operation and delayed to the subsequent clock cycle. A FeRAM memory cell having two ports is needed so that consecutive operations do not conflict with each other. A read operation is initiated through a first port in a first clock cycle. In the subsequent clock cycle, the rewrite finishes through the first port. The next operation utilizes the second port, without conflicting with the rewrite process. By alternating ports used in each clock cycle, the rewrite step is hidden in the subsequent clock cycle to shorten the read operation. In an alternate method, all read operations are initiated through one port, while the second port is reserved exclusively for write operations and rewrites.

8 Claims, 6 Drawing Sheets

METHOD AND APPARATUS FOR SHORTENING READ OPERATIONS IN DESTRUCTIVE READ MEMORIES

FIELD OF THE INVENTION

The invention is directed towards semiconductor memory circuits, and more specifically, towards a method and apparatus for shortening the read operations of destructive read memory circuits.

BACKGROUND OF THE INVENTION

FIG. 1A shows a prior art "one transistor, one capacitor" (1T1C) memory cell 10, the basic building block for ferroelectric random-access memories (FeRAMs). The 1T1C memory cell 10 has a single transistor M1 connected in series to one terminal of a ferroelectric capacitor Cfe. The other terminal of the ferroelectric capacitor Cfe is connected to a plateline PL. The gate of the transistor M1 is connected to a word line WL, while the source of the transistor M1 is connected to a bitline BL.

Two basic operations are used to access the 1T1C memory cell 10: a write and a read operation. During a write operation, the data value is placed on the bitline BL, and the word line WL is asserted. Then, the plateline PL is pulsed to store the data value on the ferroelectric capacitor $C_{fe}$. For more detailed information about the operation of a FeRAM cell, please see "A Survey of Circuit Innovations in Ferroelectric Random-Access Memories" by A. Sheikholeslami and P. Glenn Gulak, Proceedings of the IEEE, Volume 88, No. 5, May 2000.

During a read operation, the bitline BL is first pre-charged to a predetermined known value. Then, the word line WL and then the plateline PL are asserted. The charge on the bitline BL is redistributed between the bitline BL and the capacitor $C_{fe}$, resulting in a voltage swing on the bitline BL. The magnitude of this voltage swing indicates the value of the data previously stored on the capacitor $C_{fe}$. The voltage swing is typically small and needs to be amplified to full rail, using a sense amplifier. The read operation is a destructive process, since the value stored must be overwritten in order to determine its value. The original stored value must be preserved elsewhere, and then written back to the memory cell after a read operation is performed. This write-back process is known as a "rewrite." The read operation is typically much slower than the write operation, since it takes time for the charge redistribution to take place and settle to a final value.

To construct a memory, the 1T1C memory cells 10 are arranged into one or more large arrays, a design structure that is well known in the art. Each array consists of multiple rows of words, a "word" being the basic unit for reading from and writing to the memory. Only a single word can be selected for reading from or writing to an array at any given time. For detailed information on memory arrays, please see chapter 10 of "Digital Integrated Circuits: A Design Perspective" by Jan M. Rabaey, Upper Saddle River, N.J., Prentice-Hall, Inc., 1996.

FIG. 1B shows a flowchart of two consecutive clock cycles, cycle N and cycle N+1, for a FeRAM made of an array of cells such as 1T1C memory cell 10. Cycle N is a read operation. A memory address is selected in step 101. In step 103, the word is ready and available for reading. Finally, in step 105, the word is restored to the memory during the rewrite. Step 107 begins cycle N+1 and the start of the next read or write operation.

As mentioned previously, the read operation takes much longer than the write operation. To accommodate the length of the read operation, a long clock cycle must be used. However, since the clock cycle is inversely proportional to the speed of the memory, a memory built using 1T1C memory cells is relatively slow.

SUMMARY OF THE INVENTION

In accordance with a preferred embodiment of the present invention, a method for shortening the read operation in a destructive read memory is disclosed. The read operation is shortened by omitting the rewrite step and delaying it to the subsequent clock cycle, when a new operation is initiated. Since the read operation is typically the longest operation for a memory cell, shortening the read operation also results in a shorter clock cycle and faster memory.

To simultaneously perform both the rewrite step as well as a subsequent operation, a FeRAM memory cell must have two ports. This FeRAM memory cell is also known as a "two transistor, one capacitor" (2T1C) memory cell. When the 2T1C memory cell is arrayed in a memory, the memory will have two sets of ports. The first set of ports accesses the same memory cells as the second set of ports. This allows two different words to be accessed in the memory at the same time.

A first set of ports is used to read a word during a read operation in a first clock cycle. In the subsequent clock cycle, a read or write operation begins simultaneously as the rewrite step begins. The rewrite step finishes rewriting the word through the first set of ports, where the read operation was initiated. Meanwhile, the subsequent clock cycle and operation use the second set of ports, without conflicting with the rewrite process that is finishing up through the first set of ports. By alternating the sets of ports used in each clock cycle, the rewrite step can always be delayed to the subsequent clock cycle. This method "hides" the rewrite step behind the next operation, thus shortening the time needed for a read operation. Hereinafter, this method will be known as the "alternating port method".

Another method for shortening the clock cycle in a destructive read memory is disclosed. The read operation is shortened by omitting the rewrite step, delaying it to the subsequent clock cycle, and implementing the rewrite as a write operation. All read operations are initiated through one set of ports, while the second set of ports is reserved exclusively for write operations and rewrites. This method shall be referred to hereinafter as the "fixed port method".

In an alternate embodiment, a DRAM memory cell can also be equipped with two transistors to implement the methods disclosed above. This concept of using two transistors can be applied to any destructive read charge-based memory scheme that currently uses a 1T1C structure.

Further features and advantages of the present invention, as well as the structure and operation of preferred embodiments of the present invention, are described in detailed below with reference to the accompanying exemplary drawings. In the drawings, like reference numbers indicate identical or functionally similar elements.

DETAILED DESCRIPTION

Figure 1B:
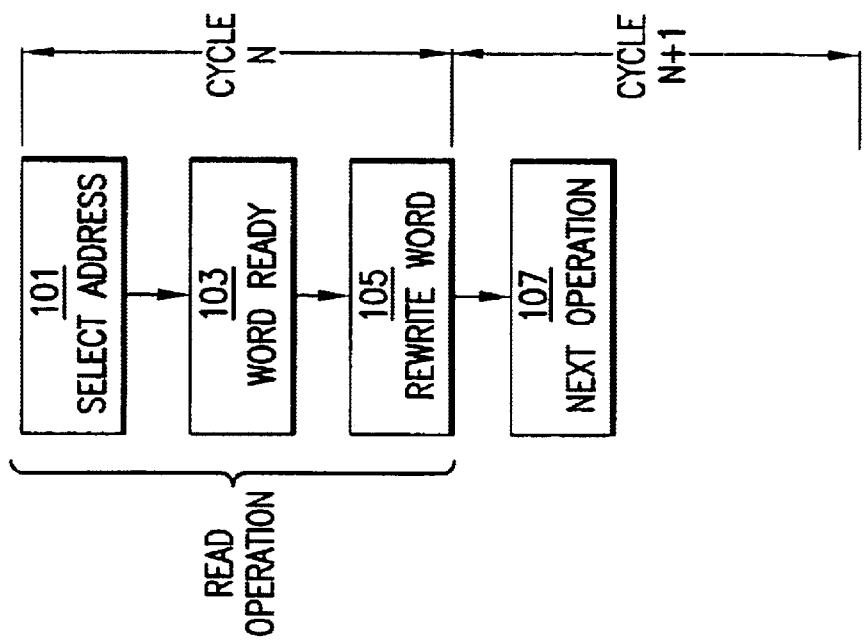
FIG. 1B shows a flowchart of two consecutive clock cycles, cycle N and cycle N+1, for a FeRAM made of an array of cells such as the one shown in FIG. 1A.
Figure 2A:
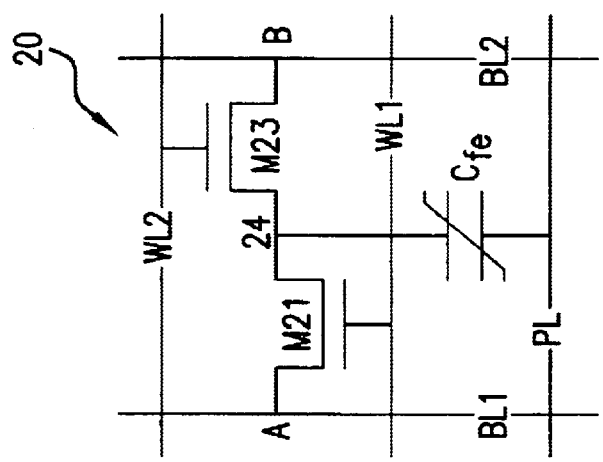
FIG. 2A is a schematic of a FeRAM cell according to the present invention.
Figure 1A:
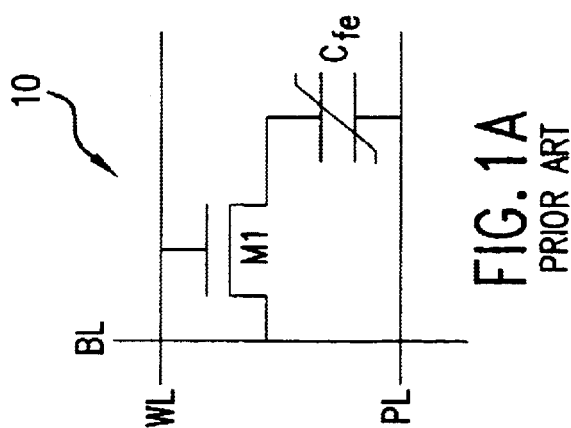
FIG. 1A is a schematic of a FeRAM cell according to the prior art.

FIG. 2A shows a preferred embodiment made in accordance with the teachings of the present invention. A FeRAM cell 20 has two ports for access to a ferroelectric capacitor $C_{fe}$, which functions as a data storage element. Port A is the source of transistor M21. Port B is the source of transistor M23. The transistors are used as switches to control access to the data storage element through the two ports. Besides transistors, other devices having switch-like properties may also be used. Likewise, other data storage elements besides ferroelectric capacitors may also be used.

The drains of the transistors M21 and M23 are connected at node 24. The ferroelectric capacitor $C_{fe}$ interposes node 24 and a plateline PL. The gate of transistor M21 is connected to a wordline WL1. The gate of transistor M23 is connected to a wordline WL2. The wordlines switch the transistors on or off to allow access to the ferroelectric capacitor $C_{fe}$ through port A or port B. The source of transistor M21 is connected to a bitline BL1, while the source of transistor M23 is connected to a bitline BL2. Data that is written to or read from the ferroelectric capacitor $C_{fe}$ through port A is placed on bitline BL1. Data that is written to or read from the ferroelectric capacitor $C_{fe}$ through port B is placed on bitline BL2.

Figure 2B:
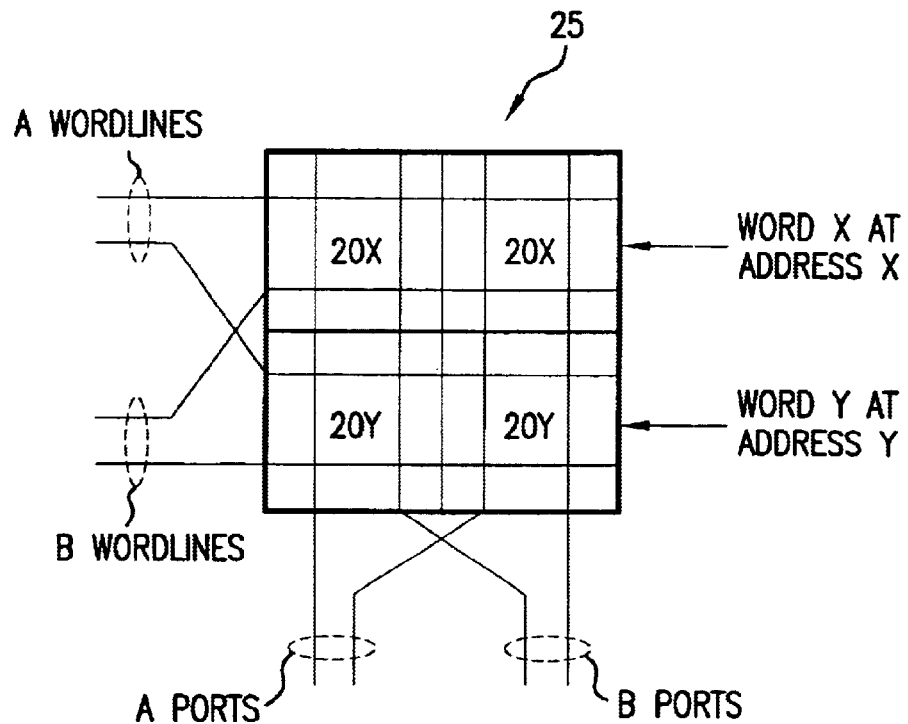
FIG. 2B shows four FeRAM cells arranged into a 2×2 memory array, for use with the alternating port method.

FIG. 2B shows four FeRAM cells 20 arranged into a 2×2 memory array 25, for use with the alternating port method. The methods and concepts illustrated using memory array 25 are applicable to larger arrays. Two FeRAM cells 20X form word X at memory address X. Two FeRAM cells 20Y form word Y at memory address Y. Memory array 25 has two sets of ports: A ports and B ports. Memory array 25 also has two sets of wordlines: A wordlines and B wordlines. Only a single A wordline is asserted at any given time. Only a single B wordline is asserted at any given time.

Figure 2C:
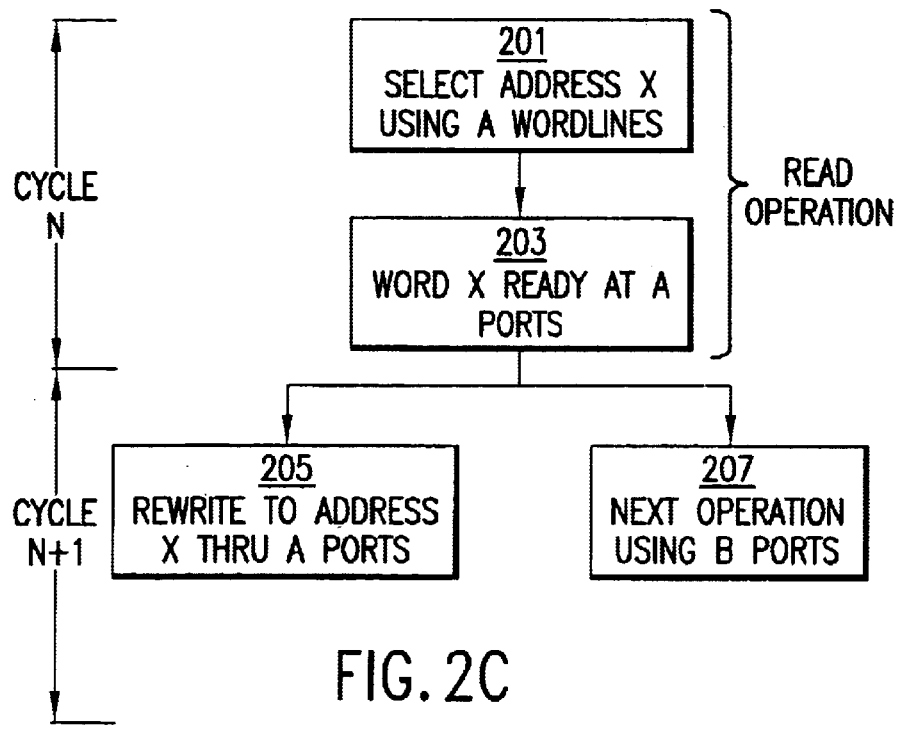
FIG. 2C shows a flowchart for the alternating port method.

FIG. 2C shows a flowchart for the alternating port method. Two consecutive clock cycles, cycle N and cycle N+1, are shown. A read operation at address X of memory array 25 occurs in cycle N, and the rewrite step back to address X occurs in cycle N+1. In step 201, the A wordline corresponding to address X is asserted. Next, in step 203, the word X appears on the A ports to be read.

At this point, the read operation and cycle N finish, while cycle N+1 begins. The rewrite takes place in step 205, rewriting through the A ports to restore word X to address X. Simultaneously, the next operation is initiated in step 207, using the B wordlines to select a second address Y, and using the B ports to access the memory cells of word Y for a read or a write. The rewrite step 205 finishes before the end of cycle N+1 is reached. The operation after step 207 is initiated using the A ports again. The sequence of operations will continue in this fashion, alternating between the A ports and the B ports. It is only necessary to alternate ports when a read operation leads into another operation. Consecutive write operations can take place using the same set of ports without switching. Control circuitry is needed in the memory to govern the alternation of operations. By shifting the rewrite step to the subsequent clock cycle, the read operation is shortened and the amount of time needed for a clock cycle reduced.

Since the rewrite portion of the read operation is delayed to the next cycle, a read operation followed by another read operation at the same address might return invalid data if the first read operation has not finished rewriting the data back. Therefore, the memory may need an input/output cache to store the data that has just been read, as well as circuitry to detect when the same address is being accessed two times in a row. In the event that two read operations accessing the same address should occur in a row, the second read operation simply fetches the data from the cache.

In an alternate embodiment of the present invention, the fixed port method can be used to shorten the read operation in a destructive read memory. This method also delays the rewrite step to the subsequent clock cycle, and applies to arrays using the same FeRAM cell 20 shown in FIG. 2A. However, all read operations are initiated using one set of ports, while the second set of ports is reserved exclusively for write operations and rewrites. The rewrite step is implemented as a write operation with address lookup. All write operations (other than rewrites) are delayed one clock cycle.

Referring back to FIG. 2A, port A is designated the READ port so that all read operations access the ferroelectric capacitor $C_{fe}$ through transistor M21. Similarly, port B is designated the WRITE port so that all write operations access the ferroelectric capacitor $C_{fe}$ through transistor M23. These designations are arbitrary and can be switched so that port A is the write port, while port B functions as the read port. Some optimizations may be performed on either transistor to optimize the read and write functions. For example, a thicker gate oxide may be implemented in the transistor used during the write operations, since a higher wordline voltage is typically required for the write operation.

Figure 3A:
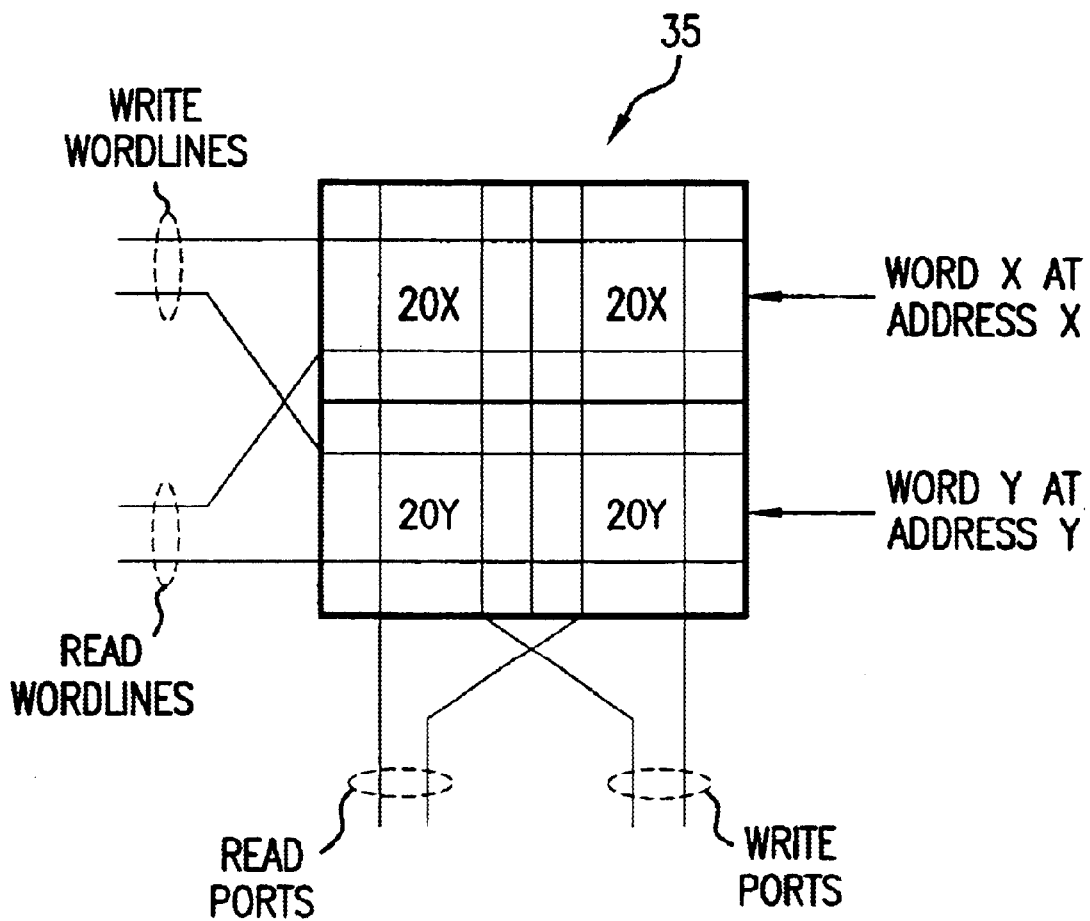
FIG. 3A shows four FeRAM cells arranged into a 2×2 memory array, for use with the fixed port method.

FIG. 3A shows four FeRAM cells 20 arranged into a 2×2 memory array 35, for use with the fixed port method. Memory array 35 is identical to memory array 25 of FIG. 2B—only label names have been changed. Memory array 35 has two sets of ports: READ ports and WRITE ports. Memory array 35 also has two sets of wordlines: READ wordlines and WRITE wordlines. Only a single READ wordline is asserted at any given time. Only a single WRITE wordline is asserted at any given time.

Figure 3B:
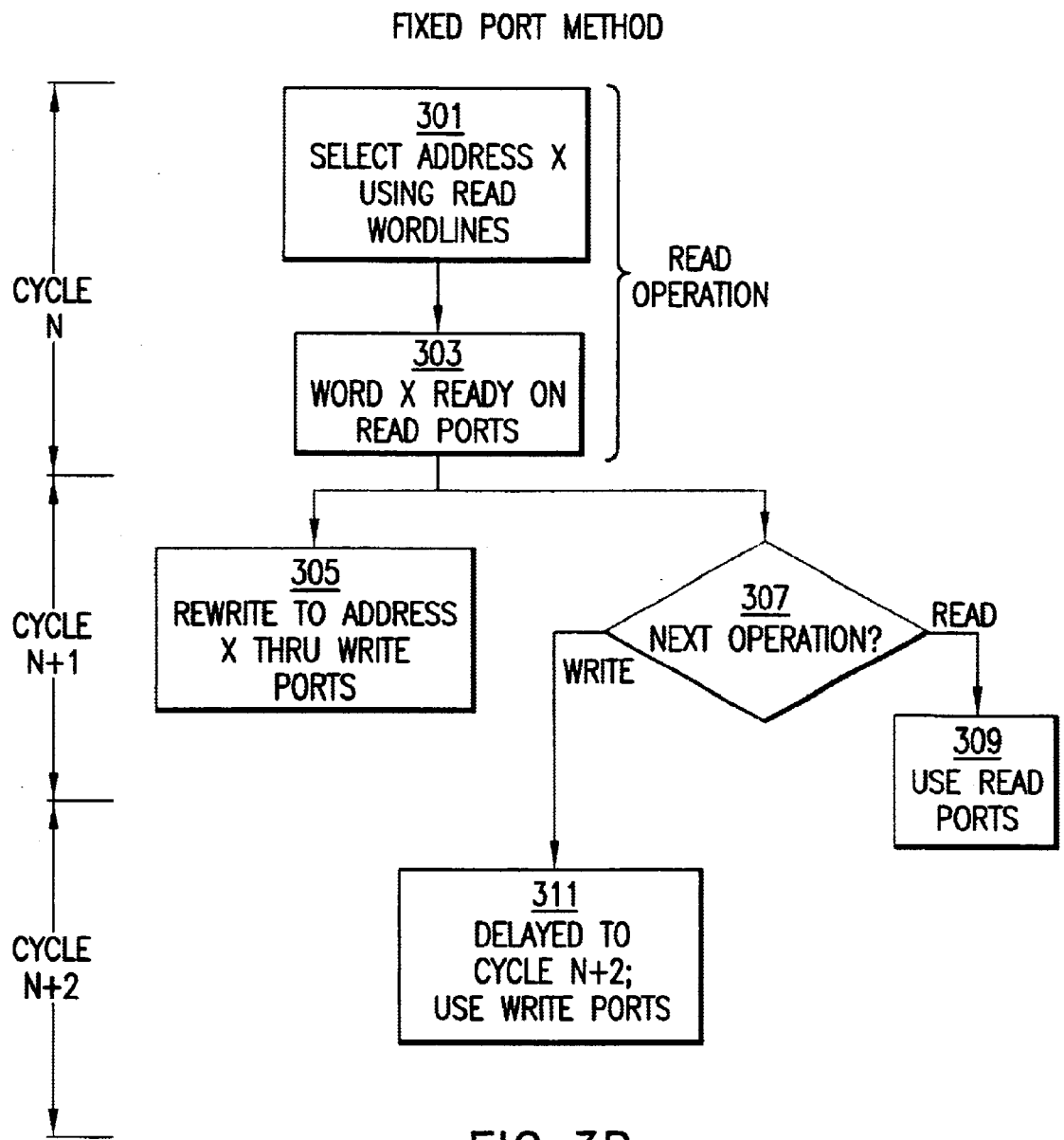
FIG. 3B shows a flowchart for the fixed port method.

FIG. 3B shows a flowchart for the fixed port method. Two consecutive clock cycles, cycle N and cycle N+1, are shown. A read operation at address X of memory array 35 occurs in cycle N, and the rewrite back to address X occurs in cycle N+1. In step 301, the READ wordline corresponding to address X is asserted. Next, in step 303, word X appears on the READ ports.

At this point, the read operation and cycle N finish, while cycle N+1 begins. The rewrite step is implemented in step 305, writing back to address X using the WRITE ports. Simultaneously, the next operation is initiated in step 307. If the next operation is another read operation, the READ ports are used to access the data. If the next operation is a write operation, then the operation is delayed to the next cycle (cycle N+2) to allow the rewrite in step 305 to finish. The write data may be temporarily stored in a cache until cycle N+2. Once cycle N+1 is finished and cycle N+2 is reached, the write operation proceeds using the write ports.

Since the rewrite and the write operation are always delayed one cycle, a read or write operation followed by a read operation at the same address may return invalid data. Therefore, the memory may need an input/output cache to store the data that has just been read or is to be written, as well as circuitry to detect when the same address is being accessed two times in a row. In the event that any operation is followed by a read operation accessing the same address, the read operation simply fetches the data from the cache.

Figure 4:
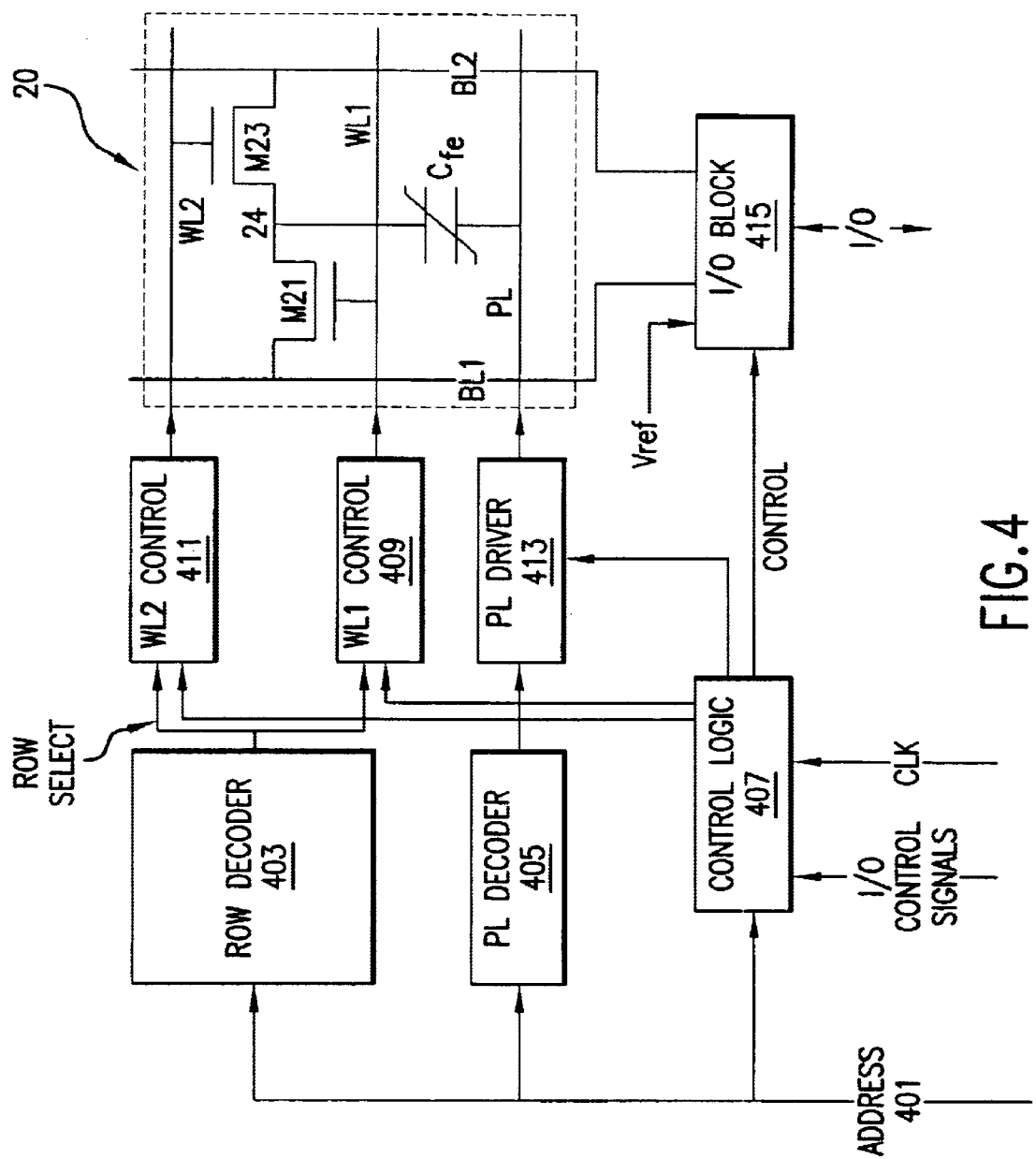
FIG. 4 is a block diagram for a FeRAM cell and auxiliary circuitry.

FIG. 4 is a block diagram for a FeRAM memory cell 20 and auxiliary circuitry to implement the present invention. Although only a single FeRAM memory cell 20 is shown in FIG. 4 to simplify explanation, it should be understood that FeRAM memories are typically constructed with an array of memory cells like FeRAM memory cell 20. Any person with ordinary skill in the art can extrapolate the circuitry shown in FIG. 4 to apply to such an array of cells.

The memory address 401 feeds into a row decoder 403, a PL decoder 405, and a control logic block 407. The row decoder 403 outputs a row select signal to a WL1 control block 409 and a WL2 control block 411, which control the wordlines WL1 and WL2 of the FeRAM memory cell 20, respectively. The PL decoder 405 controls the PL driver 413, which in turn controls the plateline PL. The control logic block 407 has additional inputs such as the I/O control signals and the clock CLK. The control logic block 407 includes functionality such as read/write control, same address detection, etc., and has control signals for controlling the WL2 control block 411, the WL1 control block 409, and the PL driver 413. If the alternating port method is to be employed, then the control logic block 407 includes circuitry to govern the switching from A ports to B ports, from clock cycle to clock cycle. If the fixed port method is used, then the control logic block 407 includes circuitry to direct all read operations to be conducted using the READ ports, and write operations and rewrites to be conducted using the WRITE ports.

The control logic block also controls an I/O block 415 that interfaces between the FeRAM memory cell 20 and the I/O. The I/O block 415 includes: a sense amplifier to amplify the voltage swing on the bitlines during a read operation; write-back circuitry that writes data back to the FeRAM memory cell 20 during a rewrite or write operation; and an input/output cache for receiving and storing values. A reference voltage Vref is provided to the I/O block 415 for the sense amplifier. The input/output cache may also be located in the control logic block, if needed. An example of a sense amplifier and write-back circuitry suitable for use in the I/O block of the present invention is disclosed in U.S. patent application Ser. No. 09/991,571, entitled "Sense Amplifier with Independent Write-Back Capability for Ferroelectric Random-Access Memories".

Figure 5:
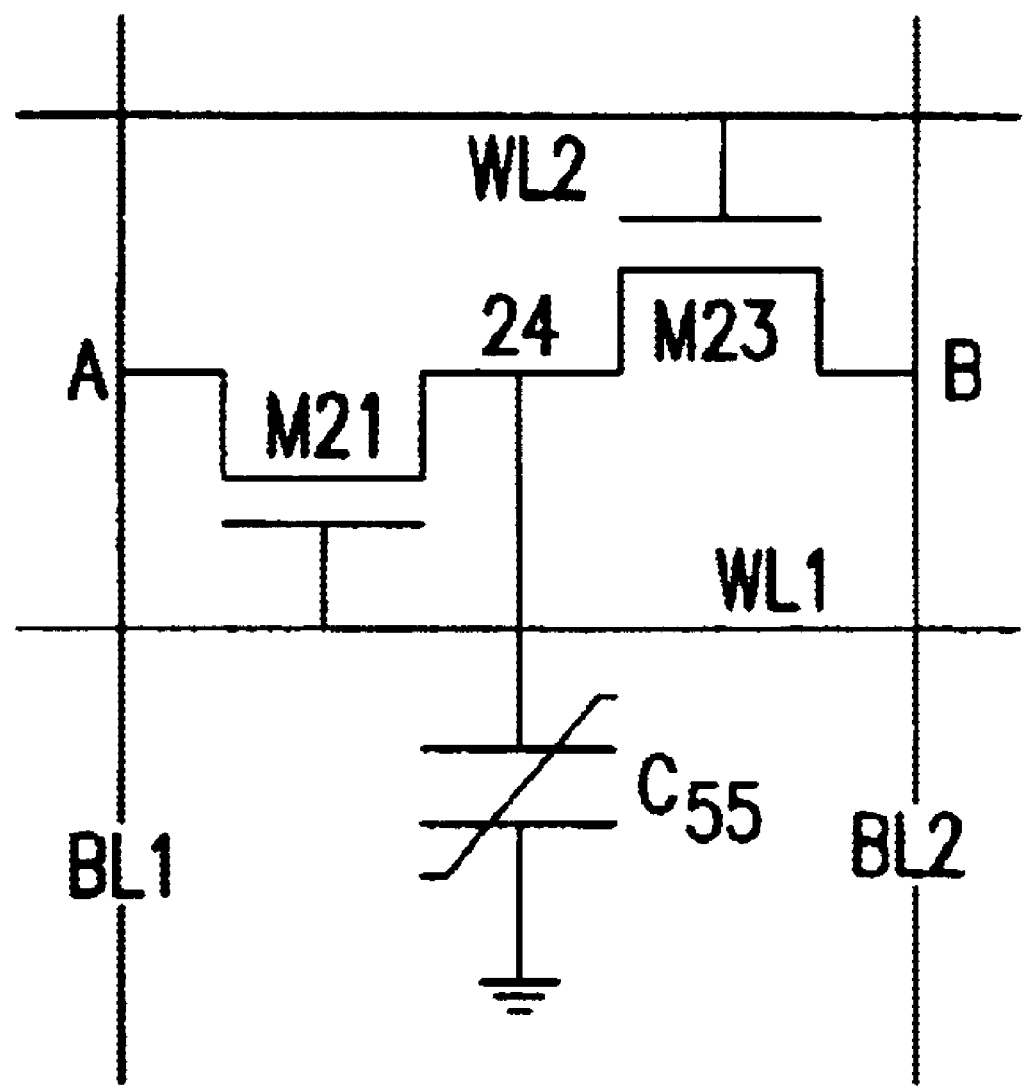
FIG. 5 is a schematic of a DRAM memory cell according to the present invention.

Up until now, the present invention has been illustrated with ferroelectric memory cells and FeRAMs. FeRAMs are superior to other non-volatile memories because they have shorter write-access times, lower power consumption, and can be easily embedded into a larger integrated circuit to provide system-on-a-chip solutions. However, the present invention is equally applicable to other types of memories. FIG. 5 is a schematic of an alternate embodiment of a memory cell made according to the present invention. A DRAM memory cell is equipped with two transistors. The DRAM memory cell is exactly the same as a FeRAM memory cell, except that a standard capacitor C55 is used in place of a ferroelectric capacitor, and no plateline is needed. The methods previously disclosed for shortening the clock cycle in a FeRAM memory cell are also applicable to this DRAM memory cell. This concept of using two transistors to access the data storage element can be applied to any destructive read charge-based memory structures that use a 1T1C structure.

Although the present invention has been described in detail with reference to particular preferred embodiments, persons possessing ordinary skill in the art to which this invention pertains will appreciate that various modifications and enhancements may be made without departing from the spirit and scope of the claims that follow.

We claim:

1. A memory cell, comprising:

a first and second port;

a ferroelectric capacitor for data storage, having a first and second electrode;

a first switch connecting the first port to the first electrode of the ferroelectric capacitor during a read or write operation;

a second switch connecting the second port to the first electrode of the ferroelectric capacitor during a read or write operation; and a memory cache coupled to the first and second port that stores the data from a read operations for rewrite back to the ferroelectric capacitor.

2. A memory cell as in claim 1, wherein a read operation accesses the ferroelectric capacitor through a different port than the port used by the subsequent operation.

3. A memory cell as in claim 1, wherein the first port is used exclusively to access the ferroelectric capacitor during a read operation, and the second port is used exclusively to access the ferroelectric capacitor during a write operation.

4. A method for operating a memory array, comprising:

providing an array of memory cells;

performing a destructive read of data from a memory cell in a first clock cycle without rewriting the data; and rewriting the data to the memory cell in the subsequent clock cycle.

5. The method as in claim 4, wherein:

each memory cell is accessible through a first and a second port;

the read operation accesses a memory cell via a first port; and the rewrite also accesses the memory cell via the first port.

6. The method as in claim 5, wherein the read operation and the subsequent operation access the memory cells of the array using different ports.

7. The method as in claim 4, wherein performing a read operation reads from the memory array exclusively via the first ports;

performing the rewrite accesses the memory array exclusively via the second ports; and performing a write operation writes to the memory array exclusively via the second ports.

8. The method as in claim 7, further comprising:

delaying the write operation by one clock cycle.

* * * * *